(12) United States Patent
Nicollini et al.

(10) Patent No.: US 10,416,702 B2
(45) Date of Patent: Sep. 17, 2019

(54) BANDGAP REFERENCE CIRCUIT, CORRESPONDING DEVICE AND METHOD

(71) Applicant: STMicroelectronics S.r.l., Agrate Brianza (MB) (IT)

(72) Inventors: Germano Nicollini, Piacenza (IT); Stefano Polesel, Treviso (IT)

(73) Assignee: STMicroelectronic S.r.l., Agrate Brianza (MB) (IT)

(*) Notice: Subject to any disclaimer, the term of this patent is extended or adjusted under 35 U.S.C. 154(b) by 0 days.

(21) Appl. No.: 16/160,405

(22) Filed: Oct. 15, 2018

(65) Prior Publication Data
US 2019/0113946 A1 Apr. 18, 2019

(30) Foreign Application Priority Data
Oct. 17, 2017 (IT) .................. 102017000117023

(51) Int. Cl.
*G05F 3/26* (2006.01)
*H03F 3/45* (2006.01)
*G05F 3/22* (2006.01)
*G05F 3/30* (2006.01)

(52) U.S. Cl.
CPC .............. *G05F 3/265* (2013.01); *G05F 3/225* (2013.01); *G05F 3/30* (2013.01); *H03F 3/45475* (2013.01); *H03F 2200/129* (2013.01); *H03F 2203/45116* (2013.01); *H03F 2203/45528* (2013.01)

(58) Field of Classification Search
CPC ............ G05F 3/26; G05F 3/265; G05F 3/267; G05F 3/02; G05F 3/16; G05F 3/30; G05F 1/10; G05F 1/461; G05F 1/463; H03F 1/30; H03F 1/3247; H03F 1/3252
See application file for complete search history.

(56) References Cited

U.S. PATENT DOCUMENTS

| 7,173,407 | B2* | 2/2007 | Marinca ................ | G05F 3/262 323/316 |
| 7,598,799 | B2* | 10/2009 | Marinca .................. | G05F 3/30 327/539 |
| 7,629,785 | B1* | 12/2009 | Drebinger ................ | G05F 3/30 323/313 |

(Continued)

OTHER PUBLICATIONS

Italian Search Report and Written Opinion for IT Appl. No. 102017000117023 dated Jun. 21, 2018 (8 pages).

(Continued)

*Primary Examiner* — An T Luu
(74) *Attorney, Agent, or Firm* — Crowe & Dunlevy (57) ABSTRACT

A first current proportional to absolute temperature flows in a first current line through a first p-n junction and a second p-n junction arranged in series. A cascaded arrangement of p-n junctions is coupled to the second p-n junction and includes a further p-n junction with a current flowing therethrough that has a third order proportionality on absolute temperature. A differential circuit has a first input coupled to the further p-n junction and a second input coupled to a current mirror from the first p-n junction, with the differential circuit configured to generate a bandgap voltage with a low temperature drift from a sum of first voltage (that is PTAT) derived from the first current and a second voltage (that is $PTAT^3$) derived from the third current.

22 Claims, 3 Drawing Sheets

(56) References Cited

U.S. PATENT DOCUMENTS 7,780,346 B2 *  8/2010  Chellappa ................ G01K 7/01
                                                          327/512
2008/0224759 A1  9/2008  Marinca

OTHER PUBLICATIONS

New Developments in IC Voltage Regulators, R.J. Widlar, IEEE Journal of Solid-State Circuits, Feb. 1971.
A Precision Curvature-Compensated CMOS Bandgap Reference, B. S. Song et al., IEEE JSSC, Dec. 1983.
Accurate Analysis of Temperature effects in IC-VBE Characteristics with Application to Bandgap Reference Sources—Y. Tsividis—IEEE JSSC, Dec. 1980.
Curvature-Compensated BiCMOS bandgap with 1V Supply Voltage, P. Malcovati et al., IEEE JSSC, Jul. 2001.

* cited by examiner

BANDGAP REFERENCE CIRCUIT, CORRESPONDING DEVICE AND METHOD

PRIORITY CLAIM

This application claims the priority benefit of Italian application for Patent No. 102017000117023, filed on Oct. 17, 2017, the content of which is hereby incorporated by reference in its entirety to the maximum extent allowable by law.

TECHNICAL FIELD

The description relates to bandgap reference circuits.

BACKGROUND

So-called bandgap reference generators represent a conventional solution in the electronic field for providing absolute voltage references in a wide variety of applications.

A reduced temperature drift (TD) over a temperature range of interest is a desirable feature of bandgap reference circuits.

Despite the extensive activity in that area, as witnessed e.g. by various documents discussed in the following, further improved solutions are desirable.

SUMMARY

One or more embodiments may relate to a corresponding device. A device generating an "absolute" (low temperature drift) voltage is exemplary of such a device.

One or more embodiments may relate to a corresponding method.

The claims are an integral part of the technical disclosure of the invention as provided herein.

One or more embodiments may offer one or more of the following advantages:
 reduced cost and test times due to the possibility of avoiding complex circuits and/or trimming to implement curvature compensation;
 flexibility due to facilitated application to existing bandgap reference circuits;
 possible coupling with a buffer amplifier for driving purposes.

In an embodiment, a circuit comprises: an input node and an output node, the input node configured for coupling with a proportional-to-absolute-temperature (PTAT) current generator producing a current proportional to absolute temperature; a current source driven by the input node, the current source configured for producing a first current proportional to absolute temperature flowing in a first current line; a first p-n junction and a second p-n junction arranged in series in the first current line with the first current flowing therethrough; a cascaded arrangement of p-n junctions coupled to the second p-n junction and comprising a further p-n junction with a current flowing therethrough having a third order (cubic) proportionality on absolute temperature; and a differential stage having a first input coupled to the further p-n junction, a second input coupled to a current mirror from the first p-n junction, and an output from the differential stage coupled to the circuit output node.

In that way, the output from the differential stage is provided by the sum (with sign) of a $V_{BE}$, though which a cubic PTAT biasing current flows, plus a PTAT voltage across the feedback resistor R/N, resulting in a bandgap reference $V_{BG}$ with a (very) small temperature drift (TD).

The embodiment further comprises: a supply line with the first current line between the supply line and ground; a second current line between the supply line and ground with a transistor between the supply line and an intermediate node and a resistor between the intermediate node and ground, the transistor having a control terminal driven by the second p-n junction in the first current line; a further transistor arranged with the current path therethrough providing a third current line between the supply line and ground, the further transistor having a control terminal coupled to the intermediate node in the second current line, the further transistor comprising said further p-n junction.

One or more embodiments may comprise a current mirror transistor coupled to the first p-n junction in the first current line with a mirror current of the first current—that is a current identical or proportional to the first current—flowing in the current path through the current mirror transistor, the differential stage having the second input coupled to the current path through the current mirror transistor.

In one or more embodiments, the first p-n junction and the second p-n junction may include transistors having a current path therethrough and a control terminal shorted to the current path in a diode-like arrangement.

In one or more embodiments, the transistors may include bipolar transistors having an emitter-collector current path therethrough and a base control terminal.

In one or more embodiments, the current source may include a transistor having a control terminal driven by the input node.

In one or more embodiments, the current source transistor may include a field effect transistor, optionally a MOSFET transistor.

One or more embodiments may include a feedback path coupling the output the differential stage to the second input of the differential stage.

In one or more embodiments, the feedback path in the differential stage may include a feedback resistor wherein the voltage drop across the feedback resistor is proportional to said current proportional to absolute temperature.

In one or more embodiments, the first input and the second input of the differential stage are the non-inverting input and the inverting input, respectively, to the differential stage.

In an embodiment, a device comprises: a proportional-to-absolute-temperature (PTAT) current generator producing a current proportional to absolute temperature; a circuit according to one or more embodiments as discussed above that is arranged with the input node coupled to the PTAT current generator.

In an embodiment, a method comprises: producing a current proportional to absolute temperature via a proportional to absolute temperature (PTAT) current generator; providing a circuit according to one or more embodiments as discussed above and coupling the input node thereof to the PTAT current generator.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As noted, so-called bandgap reference generators may represent a solution in the electronic field for providing absolute voltage references (see, Widlar: "New Developments in IC Voltage Regulators", IEEE Journal of Solid-State Circuits, vol. 6, no. 1, pp. 2-7, February 1971).

Figure 1:
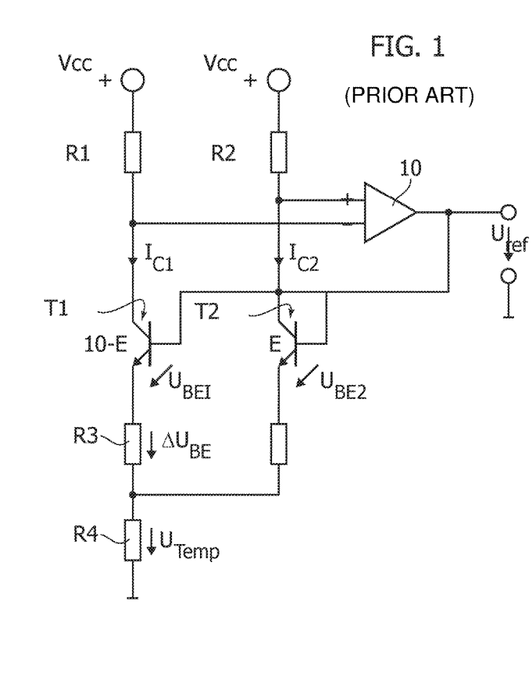
FIG. 1, is an exemplary circuit diagram of a bandgap reference generator.

A possible schematic of a corresponding circuit is shown in FIG. 1.

Two p-n junctions (e.g. diodes or p-n junctions in two bipolar transistors T1, T2) are operated at different current densities $I_{C1}$ and $I_{C2}$ derived from a voltage line at a voltage $V_{CC}$ via bias resistors R1 and R2.

The voltage difference $\Delta U_{BE}$ between the two p-n junctions is used to generate a Proportional To Absolute Temperature (PTAT) current in a first resistor R3, and in turn this current is used to generate a PTAT voltage across a second resistor R4. This PTAT voltage is added to the voltage across one of the junctions, e.g. $U_{BE2}$.

The voltage across a diode operated at constant current (or, here, with a PTAT current) is Complementary To Absolute Temperature (CTAT), via a factor of approximately −2 mV/K (see, Y. P. Tsividis: "Accurate analysis of temperature effects in Ic-Vbe characteristics with application to bandgap reference sources", IEEE Journal of Solid-State Circuits, vol. 15, no. 6, pp. 1076-1084, December 1980).

In an arrangement as exemplified in FIG. 1, a sum (with sign) of the PTAT voltage across resistor R4 and the CTAT voltage across the junction $U_{BE2}$ may be produced via a differential stage 10 having its inputs coupled between R1, T1 and R2, T2, respectively to produce a reference signal $U_{ref}$.

When summing in such a way a PTAT voltage and a CTAT voltage, only the linear terms in the voltage are compensated, while the higher-order terms are limiting the Temperature Drift (TD) of the bandgap reference circuit over the temperature range of interest.

If the ratio between the first and second resistors R3, R4 is chosen properly, the first order effects of the temperature dependency of the diode and the PTAT voltage will cancel out. The resulting voltage is about 1.2-1.25 V, depending on the particular technology and circuit design, and is close to the theoretical 1.22 eV bandgap of silicon a zero degrees K. The remaining voltage change over the typical operating temperature range of integrated circuits is of the order of a few millivolts (see, e.g., Widlar or Tsividis, already cited).

Figure 2:
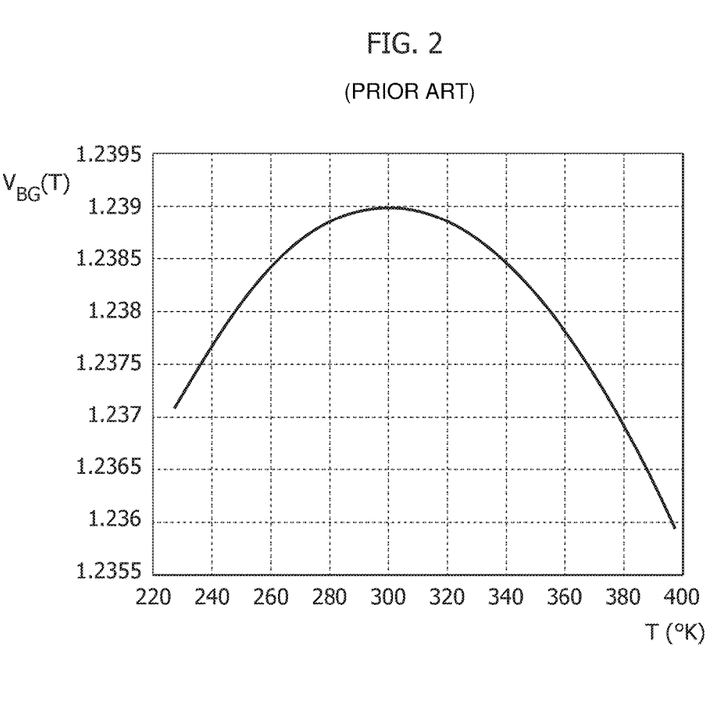
FIG. 2, is a diagram exemplary of possible performance of a generator as shown in FIG. 1.

FIG. 2 is exemplary of a possible corresponding behavior of a reference bandgap $V_{BC}(T)$—ordinate scale—as a function of temperature K—abscissa scale.

It can be demonstrated that in an ideal case the best temperature drift (TD) reachable is about 7 ppm/° C. from −40° C. to 110° C. and about 15 ppm/° C. from −40° C. to 130° C., with some possible variations related to technology (see again, e.g., Widlar or Tsividis, already cited).

While such a temperature drift may be acceptable for various applications, certain high-performance applications require (much) lower temperature drift values, e.g., around few ppm/° C. or less.

A way of compensating high-order non-linearities, thus achieving improved temperature drift values, involves a so-called curvature compensation technique.

Several corresponding solutions are reported in the literature: see, Song et al., "A Precision Curvature-Compensated CMOS Bandgap Reference", IEEE Journal of Solid-State Circuits, vol. 18, no. 6, pp. 634-643, December 1983 or Malcovati, et al., "Curvature-compensated bicmos bandgap with 1-V supply voltage", IEEE Journal of Solid-State Circuits, vol. 36, no. 7, pp. 1076-1081, July 2001).

These solutions may be complex and/or require trim circuits that increase the test time and the final cost of circuit manufacturing.

One or more embodiments may rely on the observation (see, e.g. Song et al., already cited) that a bandgap reference voltage may be based on the following expression:

$$V_{BG}(T) = V_{G0_r} + (4 - n - \delta)V_T\left[1 - \ln\left(\frac{T}{T_r}\right)\right]$$

where $V_{G0_r}$ is the extrapolated silicon bandgap at 0° K, n is the exponent of the temperature variation of the mobility in the base of a bipolar junction transistor or BJT (typically from 0.6 to 0.8), δ is the exponent of the temperature variation of the BJT bias current, $T_r$ is the reference temperature.

Moreover, $V_T = kT/q$ is the thermal voltage, with k the Boltzmann constant, T the absolute temperature in Kelvin (° K), and q the electron charge.

The factor δ can be 0 (in the case of biasing current with no temperature variation) or 1 (in the case of PTAT biasing current), so that the second term in the above expression is not negligible and is the one responsible of the curvature of the bandgap reference versus temperature.

It is desirable to reduce inasmuch as possible the second term in the equation above by choosing for δ a value as close as possible to 4-n, with 4-n variable between 3.2 and 3.4 (depending on the value of n, i.e. on the chosen technology).

In one or more embodiments δ=3, that is may involve a BJT biasing current of the so-called $PTAT^3$ type.

Referring to the polarization of a bipolar transistor as $PTAT^n$ is conventional in the art: see, for instance, Popa, "Curvature-compensated Bandgap Reference", The 13th International Conference on Control System and Computer Science, University "Politehnica" of Bucharest, pp. 540-543, 2001, which discloses polarization of a bipolar transistor at a $PTAT^n$ current, while Filanovsky, et al., "BiCMOS Cascaded Bandgap Voltage Reference" IEEE 39th Midwest Symposium on Circuits and Systems, pp. 943-946, 1996, discloses a polarization at a PTAT³+PTAT⁴ collector current.

Figure 3:
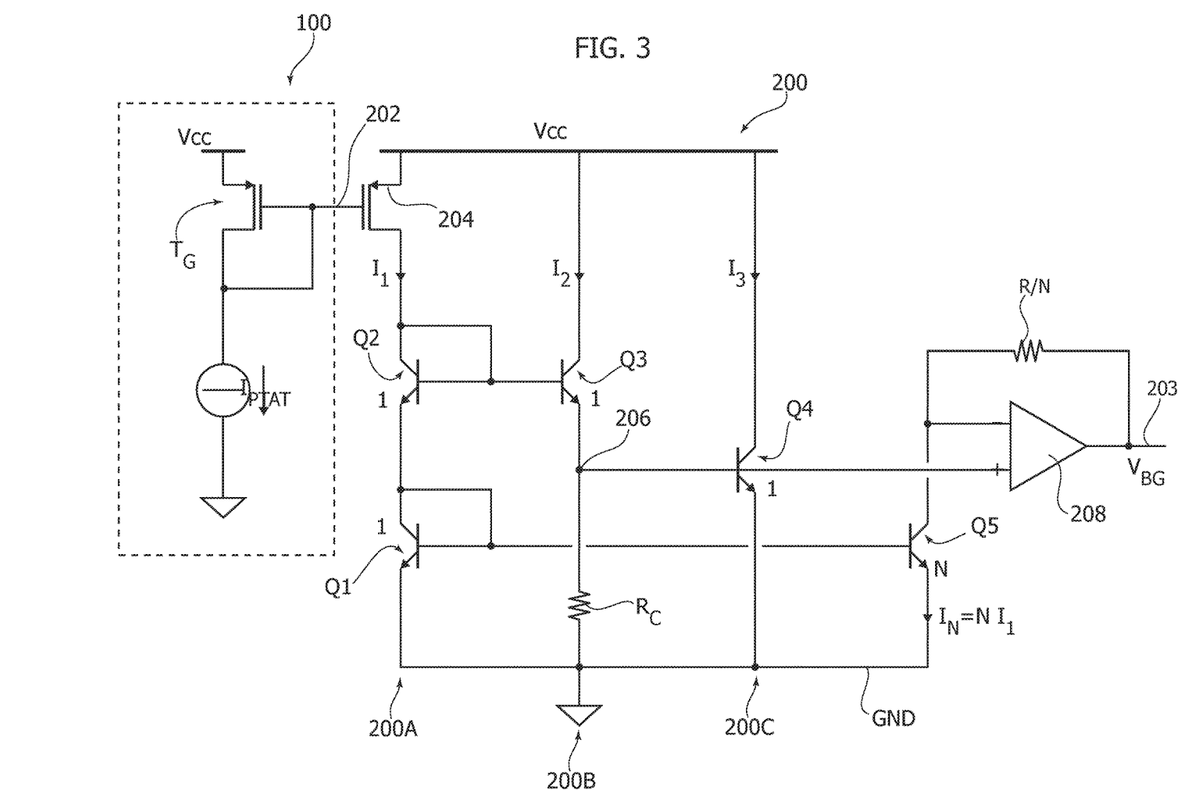
FIG. 3 is a circuit diagram exemplary of embodiments.

In an embodiment as exemplified in FIG. 3 a PTAT³ BJT biasing current is used to reduce the temperature drift (TD) without using curvature compensation circuits.

In FIG. 3, a PTAT current generator 100 is provided for generating a current $I_{PTAT}$. The generator 100 can be implemented according to any known solution for that purpose, thus making it unnecessary to provide herein a detailed description of that circuit block.

A circuit 200 comprises a trans-linear loop having an input node 202 coupled to a PTAT current generator 100 and configured to produce a bandgap (voltage) reference $V_{BG}$ at an output node 203.

The circuit 200 includes a supply line to which a supply voltage $V_{cc}$ is applied in operation and a ground line GND (possibly of a virtual or floating type).

The circuit 200 includes three branches 200A, 200B and 200C extending between the supply line ($V_{CC}$) and ground GND.

The first branch 200A (left-hand side in FIG. 3) includes a current source 204, e.g. an input transistor 204 such as a MOSFET transistor, for example, having its control terminal (gate, in the case of a field effect transistor such as a MOSFET) coupled to the input node 202 so that, with the circuit 200 coupled to the generator 100, a current $I_1$ mirroring the $I_{PTAT}$ current produced by the generator 100 flows in the current path (source-drain, in the case of a field effect transistor such as a MOSFET transistor) of the input transistor 204.

As noted, one or more embodiments may be applied to a PTAT generator 100 of any known type. In an embodiment as exemplified in FIG. 3, the generator 100 is represented for simplicity as a transistor $T_G$ (e.g. a MOSFET transistor) which generates a current $I_{PTAT}$ flowing through its current path (e.g. source-drain, in the case of a field effect transistor such as a MOSFET transistor) with the control terminal (gate, in the case of a field effect transistor such as a MOSFET transistor) shorted to the current path (e.g. drain) and coupled to the input node 202.

Various other arrangements may be devised in order to facilitate obtaining a current $I_1$ which mirrors (e.g. is identical or proportional to) the $I_{PTAT}$ current produced by the generator 100. These arrangements are per se conventional in the art, thus making it unnecessary to provide a detailed description herein.

The first branch 200A in the circuit 200 includes two p-n junctions arranged mutually in series and in turn in series with the current path of the transistor 204 so that the current $I_1$ flows therethrough. That is, the current paths through the transistor 204 and the two cascaded p-n junctions provided Q1 and Q2 are arranged in series (with homologous polarities) between Vcc and ground GND with the current $I_1$ flowing therethrough.

Providing the two p-n junction by resorting to (e.g. bipolar) transistors in a diode-like arrangement (control terminal (e.g. base) shorted to the current path (e.g. emitter-collector) at the collector, for instance, so that the base-emitter junction provides the p-n junction) may be advantageous insofar as this permits to have a same saturation current as for other transistors in the circuit (as discussed in the following) while possibly having a same area.

The second branch 200B (central position in FIG. 3) includes a transistor Q3 having its control terminal (base, in the case of bipolar transistor) coupled to the homologous terminal (e.g. base) of the transistor Q2 and its current path (emitter-collector, in the case of bipolar transistor), through which a current $I_2$ flows, coupled, e.g. at the emitter, to a resistor $R_C$ at a node 206. A line for the current $I_2$ to flow thus extends between Vcc and ground GND with the transistor Q3 between Vcc and the node 206 and the resistor $R_C$ between the node 206 and ground GND.

The third branch 200C (right-hand side in FIG. 3) includes a transistor Q4 having its control terminal (base, in the case of bipolar transistor) coupled to the tap node 206 between the transistor Q3 and the resistor Rc and its current path (emitter-collector, in the case of bipolar transistor), through which a current $I_3$ flows, extending between the supply line Vcc and ground GND.

The circuit 200 also includes a transistor (e.g. BJT) Q5 having its control terminal (base, in the case of bipolar transistor) coupled to the homologous terminal (e.g. base) of the transistor Q1 to mirror by a factor N the current through the transistor Q1, so that a current $I_N=N*I_1$ flows in current path (emitter-collector, in the case of a bipolar transistor) through the transistor Q5.

The circuit 200 further includes a differential buffer stage 208 (e.g. an op-amp) having a first (e.g. non-inverting) input coupled to the node 206 and the base of the transistor Q4 and a second (e.g. inverting) input coupled to the current path (e.g. the collector) of transistor Q5.

The differential buffer stage 208 includes a (negative) feedback path (e.g. a resistor having a resistive value R/N—where N is the mirror factor of the current mirror including the transistors Q1 and Q5) towards the second input of the stage 208 from the output of the stage 208, which may correspond to the output node 203 so that a bandgap (voltage) reference $V_{BG}$ is available at the output node 203.

Based on elementary circuit analysis, and by taking into account the logarithmic relationships (ln) provided by the p-n junctions, the following relationships apply:

$$V_{BE\_1} + V_{BE\_2} = V_{BE\_3} + V_{BE\_4} \rightarrow 2V_T \ln\frac{I_1}{I_{ss}} =$$

$$V_T\ln\frac{I_2}{I_{ss}} + V_T\ln\frac{I_3}{I_{ss}} \rightarrow \left(\frac{I_1}{I_{ss}}\right)^2 = \frac{I_2}{I_{ss}} \cdot \frac{I_3}{I_{ss}} \rightarrow I_3 = \frac{I_1^2}{I_2}$$

Since $I_1$ is PTAT, and $I_2=V_{BE\_Q4}/R_C$ is CTAT$\rightarrow$ $$I_3 = \frac{I_{PTAT}^2}{I_{CTAT}}$$

where:
$V_{BE\_j}$ is the base-emitter voltage of transistor Qj, with j= 1, . . . , 4, and
$I_{SS}$ indicates bipolar transistor saturation current.

That is, $I_3$ is given by the ratio of the square of a current $I_{PTAT}$ proportional to absolute temperature to a current $I_{CTAT}$ which is inversely proportional to absolute temperature.

At ambient temperature these currents have absolute values that are almost identical so that $I_3$ has an absolute value about equal to $I_{PTAT}$.

However, the ratio $I^2_{PTAT}/I_{CTAT}$ is a current proportional to the cube of the absolute temperature, that is a current having third order proportionality to the absolute temperature, for instance of the type $I_0(T//T_0)^3$.

In FIG. 3, $V_{BE\_4}$ is taken as a reference voltage for the non-inverting input of the amplifier 208, whereas the voltage drop on the amplifier feedback resistor R/N is given by: $I_N*R/N=NI_1*R/N=I_{PTAT}*R$.

The circuit schematic of FIG. 3 is thus exemplary of the possibility, in one or more embodiments, of producing (e.g. at the output of the amplifier 208) a bandgap (voltage) reference $V_{BG}$ at an output node 203 as the sum of a $V_{BE}$ crossed by a PTAT³ biasing current plus a PTAT voltage, resulting in a bandgap reference $V_{BG}$ for which the following expression applies:

$$V_{BG}(T) = V_{G0_r} + (4 - n - 3)V_T\left[1 - \ln\left(\frac{T}{T_r}\right)\right] = V_{G0_r} + (1 - n)V_T\left[1 - \ln\left(\frac{T}{T_r}\right)\right]$$

where the various entities in the formula indicate the parameters already introduced in the foregoing, namely:

$V_{G0r}$=extrapolated silicon bandgap at 0° K, n=exponent of the temperature variation of the mobility in the base of a bipolar junction transistor or BJT, $T_r$=reference temperature.

$V_T$=kT/q is the thermal voltage, with k the Boltzmann constant, T the absolute temperature in Kelvin (° K), and q the electron charge, with δ (the exponent of the temperature variation of the bias current in the BJT represented by Q4) set equal to 3 due to $I_3$ (the bias current through Q4) being a current of the so-called PTAT³ type, namely a current having a third order (cubic) dependence on temperature.

Figure 4:
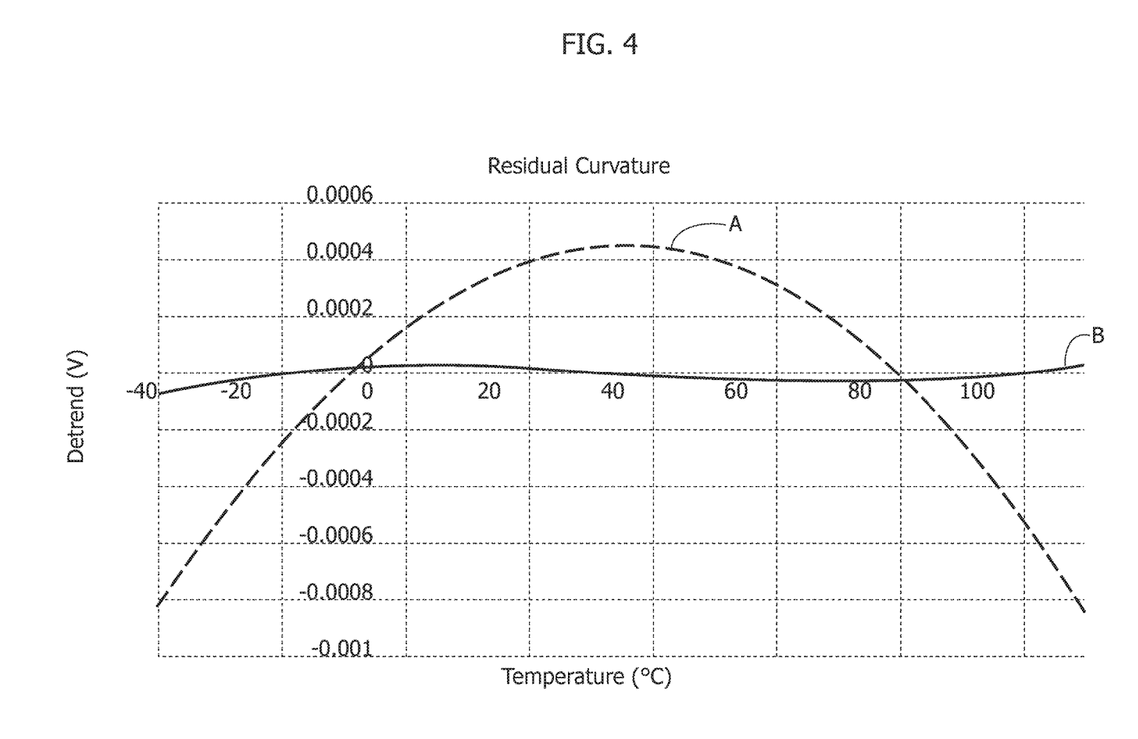
FIG. 4 is a diagram exemplary of possible performance of embodiments.

The diagram of FIG. 4 provides a comparison of the "residual curvature" (volt v. temperature) behavior of a conventional bandgap arrangement without curvature compensation (dashed line A) and an IPTAT "cube" (PTAT³) bandgap (voltage) reference $V_{BG}$ as exemplified herein (full line B).

FIG. 4 shows that arrangements according to embodiments may exhibit a temperature drift of an order of magnitude lower than a conventional one.

For instance a conventional bandgap reference may exhibit a TD of about 7 ppm/° C. from −40° C. to 110° C., whereas arrangements according to embodiments may exhibit a TD around 0.55 ppm/° C. in the same temperature range. In the latter case, the lower limit to TD may be set by bandgap non-idealities only.

A circuit (e.g. 200) according to one or more embodiments may include:
- an input node (e.g. 202) and an output node (e.g. 203), the input node configured for coupling with a proportional-to-absolute-temperature, PTAT, current generator (e.g. 100) producing a current (e.g. $I_{PTAT}$) proportional to absolute temperature,
- a current source (e.g. 204) driven by the input node, the current source configured for producing a first current (e.g. $I_1$) proportional to absolute temperature flowing in a first current line (e.g. 200A),
- a first p-n junction (e.g. Q1) and a second p-n junction (e.g. Q2) arranged in series in the first current line with the first current flowing therethrough,
- a cascaded arrangement of p-n junctions (e.g. the two p-n junctions provided by the base-emitter junctions of Q3 and Q4) coupled to the second p-n junction and comprising a further p-n junction (e.g. Q4) with a current flowing therethrough (e.g. $I_3$) having a third order (that is, cubic or PTAT³) proportionality on absolute temperature (that is, a current proportional to the cube of the absolute temperature),
- a differential stage (e.g. 208) having a first input coupled to the further p-n junction, a second input coupled to a current mirror (e.g. Q1-Q5) from the first p-n junction, and an output from the differential stage coupled to the circuit output node.

In that way, the output from the differential stage is provided by the sum (with sign) of a $V_{BE}$ (in transistor Q4), though which a PTAT³ biasing current flows, plus a PTAT voltage across the feedback resistor R/N (as provided by the drop of the Q5 PTAT current on the feedback resistor), resulting in a bandgap reference $V_{BG}$ with a (very) small temperature drift or TD.

One or more embodiments may comprise:
- a supply line (e.g. $V_{CC}$) with the first current line between the supply line and ground (e.g. GND),
- a second current line (e.g. 200B) between the supply line and ground with a transistor (e.g. Q3) between the supply line and an intermediate node (e.g. 206) and a resistor (e.g. Rc) between the intermediate node (e.g. 206) and ground, the transistor having a control terminal (e.g. base in the case of a bipolar transistor) driven by the second p-n junction in the first current line,
- a further transistor (e.g. Q4) arranged with the current path therethrough (e.g. emitter-collector, in the case of a bipolar transistor) providing a third current line (e.g. 200C) between the supply line and ground, the further transistor having a control terminal (e.g. base in the case of a bipolar transistor) coupled to the intermediate node in the second current line, the further transistor comprising said further p-n junction.

One or more embodiments may comprise a current mirror transistor (e.g. Q5) coupled to the first p-n junction (Q1) in the first current line with a mirror current (e.g. $I_N$) of the first current (e.g. $I_1$)—that is a current identical or proportional to the first current—flowing in the current path (e.g. emitter-collector, in the case of a bipolar transistor) through the current mirror transistor, the differential stage having the second input coupled to the current path through the current mirror transistor (e.g. with the current mirror transistor between the second input and ground).

In one or more embodiments, the first p-n junction and the second p-n junction may include transistors (e.g. Q1, Q2) having a current path (e.g. emitter-collector in a BJT) therethrough and a control terminal (e.g. base in a BJT) shorted to the current path (e.g at the collector) in a diode-like arrangement.

In one or more embodiments, the transistors (e.g. Q1, Q2, Q3, Q4, Q5) may include bipolar transistors having an emitter-collector current path therethrough and a base control terminal.

In one or more embodiments, the current source may include a transistor having a control terminal (e.g. gate for a FET such as a MOSFET) driven by the input node.

In one or more embodiments, the current source transistor may include a field effect transistor, optionally a MOSFET transistor.

One or more embodiments may include a feedback path (e.g. R/N) coupling the output the differential stage to the second input of the differential stage.

In one or more embodiments, the feedback path in the differential stage may include a feedback resistor wherein the voltage drop across the feedback resistor is proportional to said current (e.g. $I_{PTAT}$, via $I_N$ which mirrors $I_1$, in turn mirroring $I_{PTAT}$) proportional to absolute temperature.

In one or more embodiments, the first input and the second input of the differential stage are the non-inverting input and the inverting input, respectively, to the differential stage.

In one or more embodiments a device may include:
a proportional-to-absolute-temperature, PTAT, current generator (e.g. 100) producing a current ($I_{PTAT}$) proportional to absolute temperature,
a circuit (e.g. 200) according to one or more embodiments, arranged with the input node coupled to the PTAT current generator.

In one or more embodiments, a method may include:
producing a current (e.g. $I_{PTAT}$) proportional to absolute temperature via a proportional-to-absolute-temperature, PTAT, current generator,
providing a (translinear-loop) circuit according to one or more embodiments and coupling the input node thereof to the PTAT current generator.

Without prejudice to the underlying principles, the details and embodiments may vary, even significantly, with respect to what has been described by way of example only, without departing from the extent of protection. The extent of protection is defined by the annexed claims.

The invention claimed is:

1. A circuit, comprising:
a current sourcing circuit configured to supply a first current that is proportional to absolute temperature (PTAT) flowing in a first current line;
a first p-n junction and a second p-n junction arranged in series in the first current line with the first current flowing therethrough;
a cascaded arrangement of p-n junctions coupled to the second p-n junction and comprising a further p-n junction having a second current flowing therethrough that has a third order proportionality on absolute temperature; and
a differential circuit having a first input coupled to the further p-n junction, a second input coupled to a current mirror from the first p-n junction, and an output coupled to an output node and producing a bandgap voltage.

2. The circuit of claim 1, comprising:
a supply node with the first current line coupled between the supply node and ground;
a second current line coupled between the supply node and ground, said second current line including with a transistor coupled between the supply node and an intermediate node and a resistor coupled between the intermediate node and ground, the transistor having a control terminal driven by the second p-n junction in the first current line; and
a third current line coupled between the supply node and ground, said third current line comprising a further transistor having a control terminal coupled to the intermediate node in the second current line, the further transistor comprising said further p-n junction.

3. The circuit of claim 1, further comprising a current mirror transistor coupled to the first p-n junction in the first current line with a mirror current of the first current flowing in the current path through the current mirror transistor, the differential stage having the second input coupled to the current path through the current mirror transistor.

4. The circuit of claim 1, wherein the first p-n junction and the second p-n junction each comprise a transistor having a current path therethrough and a control terminal shorted to the current path therethrough in a diode-like arrangement.

5. The circuit of claim 4, wherein the transistor comprises a bipolar transistor having an emitter-collector current path therethrough and a base control terminal.

6. The circuit of claim 1, wherein the current sourcing circuit comprises:

a PTAT current generator circuit; and
a current source transistor in the first current line having a control terminal driven by the PTAT current generator circuit.

7. The circuit of claim 6, wherein the current source transistor comprises a field effect transistor.

8. The circuit of claim 1, further comprising a feedback path coupling the output the differential stage to the second input of the differential stage.

9. The circuit of claim 6, wherein the feedback path in the differential stage comprises a feedback resistor wherein the voltage drop across the feedback resistor is proportional to said current proportional to absolute temperature.

10. The circuit of claim 1, wherein the first input and the second input of the differential stage are the non-inverting input and the inverting input to the differential stage, respectively.

11. The circuit of claim 1, wherein p-n junctions of the first p-n junction, the second p-n junction and the cascaded arrangement of p-n junctions are formed by bi-polar transistors.

12. A circuit, comprising:
a current sourcing circuit configured to generate a first current that is proportional to absolute temperature;
a first bipolar transistor having a collector-emitter path through which the first current flows and a base and emitter that are connected;
a second bipolar transistor having a collector-emitter path through which the first current flows and a base and emitter that are connected;
a third bipolar transistor having a collector-emitter path through which a second current flows;
a fourth bipolar transistor having a collector-emitter path through which a third current flows and a base connected to the emitter of the third bipolar transistor;
a fifth bipolar transistor having a collector-emitter path through which a fourth current flows and a base connected to the base of the second bipolar transistor;
a differential amplifier having a first input coupled to receive the fourth current and a second input coupled to the bases of the third and fourth bipolar transistors, an output of the differential amplifier producing a bandgap voltage.

13. The circuit of claim 12, further comprising a first resistor through which the second current flows.

14. The circuit of claim 12, further comprising a second resistor providing a feedback path between the output of the differential amplifier and the first input.

15. The circuit of claim 12, wherein the current sourcing circuit comprises:
a proportional to absolute temperature current generator circuit; and
a MOSFET transistor coupled in a current mirror configuration with the proportional to absolute temperature current generator circuit.

16. The circuit of claim 12, wherein the second current is complementary to absolute temperature (CTAT) and the third current is cubic proportional to absolute temperature ($PTAT^3$).

17. The circuit of claim 12, wherein a voltage at the first input is PTAT and a voltage at the second input is cubic proportional to absolute temperature ($PTAT^3$).

18. A voltage generator circuit, comprising:
an input configured to receive a current that is proportional to absolute temperature (PTAT);
a circuit configured to generate from the current that is proportional to absolute temperature (PTAT) a first voltage that is PTAT and a second voltage that is cubic proportional to absolute temperature ($PTAT^3$); and an amplifier circuit configured to sum the first and second voltages to output a bandgap voltage.

19. The voltage generator circuit of claim 18, wherein said circuit comprises:

a first p-n junction and a second p-n junction arranged in series in a first current line through which the current that is proportional to absolute temperature flows; and a cascaded arrangement of p-n junctions coupled to the second p-n junction and comprising a further p-n junction having a second current flowing therethrough that has a third order proportionality on absolute temperature;

wherein the amplifier circuit has a first input coupled to the further p-n junction, a second input coupled to a current mirror from the first p-n junction, and an output coupled to an output node producing the bandgap voltage.

20. The voltage generator circuit of claim 18, wherein said circuit comprises:

a first bipolar transistor having a collector-emitter path through which the proportional to absolute temperature flows and a base and emitter that are connected;

a second bipolar transistor having a collector-emitter path through which the proportional to absolute temperature flows and a base and emitter that are connected;

a third bipolar transistor having a collector-emitter path through which a second current flows;

a fourth bipolar transistor having a collector-emitter path through which a third current flows and a base connected to the emitter of the third bipolar transistor; and a fifth bipolar transistor having a collector-emitter path through which a fourth current flows and a base connected to the base of the second bipolar transistor;

wherein the amplifier circuit has a first input coupled to receive the fourth current and a second input coupled to the bases of the third and fourth bipolar transistors, an output coupled to an output node producing the bandgap voltage.

21. The voltage generator circuit of claim 20, wherein the second current is complementary to absolute temperature (CTAT) and the third current is cubic proportional to absolute temperature ($PTAT^3$).

22. A method for producing a bandgap voltage, comprising:

generating from a current that is proportional to absolute temperature (PTAT) a first voltage that is PTAT and a second voltage that is cubic proportional to absolute temperature (PTAT3); and summing the first and second voltages to output a bandgap voltage.

* * * * *